United States Patent [19]
Kumagai

[11] Patent Number: 5,397,906
[45] Date of Patent: Mar. 14, 1995

[54] GATE ARRAY INTEGRATED SEMICONDUCTOR DEVICE HAVING STABILIZED POWER SUPPLY POTENTIALS

[75] Inventor: Kouichi Kumagai, Tokyo, Japan

[73] Assignee: NEC Corporation, Tokyo, Japan

[21] Appl. No.: 39,742

[22] Filed: Mar. 30, 1993

[30] Foreign Application Priority Data

Mar. 30, 1992 [JP] Japan ............................ 4-071830

[51] Int. Cl.[6] ...................... H01L 27/10; H01L 27/02
[52] U.S. Cl. ................................... 257/207; 257/204
[58] Field of Search ............... 257/204, 205, 207, 208, 257/900–904, 369, 202, 206, 372, 565, 566

[56] References Cited

U.S. PATENT DOCUMENTS

| | | | |
|---|---|---|---|
| 4,946,799 | 8/1990 | Blake et al. | 437/913 |
| 5,049,966 | 9/1991 | Wald | 257/369 |
| 5,072,285 | 12/1991 | Ueda et al. | 257/206 |
| 5,132,555 | 7/1992 | Takahashi | 307/296.1 |

*Primary Examiner*—Robert P. Limanek
*Assistant Examiner*—Alexander Oscar Williams
*Attorney, Agent, or Firm*—Sughrue, Mion, Zinn, Macpeak & Seas

[57] ABSTRACT

In an unused unit cell of a gate array integrated semiconductor device, a P-type semiconductor region is connected to a ground potential connection and an N-type semiconductor region is connected to a positive power supply connection, thereby reversely-biasing the P-type and N-type semiconductor regions.

15 Claims, 10 Drawing Sheets

GATE ARRAY INTEGRATED SEMICONDUCTOR DEVICE HAVING STABILIZED POWER SUPPLY POTENTIALS

BACKGROUND OF THE INVENTION

1. Field of the Invention

The present invention relates to a gate array integrated semiconductor device, and more particularly, to the stabilization of power supply potentials.

2. Description of the Related Art

In a gate array integrated semiconductor device, a large number of unit cells are regularly formed within a semiconductor in advance, and thereafter, as customers demand, interconnections are formed within each of the unit cells and between the unit cells. In such a gate array integrated semiconductor device, there are always unused unit cells where transistors are not operated. Generally, 20 to 40 percent of the unit cells are unused.

In a prior art gate array integrated semiconductor device, no interconnections are formed within the unused unit cells, even when bypass connections, which pass through the unused unit cells, are formed. This will be explained later.

On the other hand, as the integration of gate array integrated semiconductor devices has recently been developed by using a fine structure technology, the width of connections including power supply connections has become smaller, and the operation speed has become higher, to increase transient currents. Therefore, the potentials at power supply lines such as a ground potential (GND) connection and a positive power supply (Vcc) connection are fluctuated, and accordingly, these power supply potentials supplied to the unit cells are fluctuated. Particularly, when using a 0.6 $\mu$m rule, the positive power supply potential is reduced from 5 V to 3.3 V, so that the above-mentioned fluctuation of the power supply potentials is serious.

Note that the fluctuation of the power supply potentials can be compensated for a little by using a junction capacity between an impurity region (well) and a semiconductor substrate. However, in a silicon on insulator (SOI) configuration or a separation by implanted oxygen (SIMOX) configuration, since such a junction capacity is not present, the fluctuation of the power supply potentials is more serious.

SUMMARY OF THE INVENTION

It is an object of the present invention to provide a gate array integrated semiconductor device having stabilized power supply potentials.

According to the present invention, in an unused unit cell of a gate array integrated semiconductor device, a P-type semiconductor region is connected to a ground potential GND connection and an N-type semiconductor region is connected to a positive power supply Vcc connection, thereby reversely-biasing the P-type and N-type semiconductor regions. That is, a junction capacity created between the P-type and N-type semiconductor regions contributes to stabilize the potentials at the ground potential connection and the positive potential connection.

BRIEF DESCRIPTION OF THE DRAWINGS

The present invention will be more clearly understood from the description as set forth below, compared with the prior art, with reference to the accompanying drawings, wherein.

DESCRIPTION OF THE PREFERRED EMBODIMENTS

Before the description of embodiments of the present invention, a prior art BiCMOS gate array integrated semiconductor device will be explained with reference to FIGS. 1, 2A, 2B, 2C and 2D, which illustrate a BiCMOS gate array.

In FIGS. 1, 2A, 2B, 2C and 2D, a unit cell $Q_P$ for P-channel MOS transistors, and a unit cell $Q_N$ for N-channel MOS transistors, and a unit cell $Q_B$ for an NPN bipolar transistor are unused. Also, references $C_1$ and $C_2$ designate power supply connections to which the ground potential GND and a positive power supply potential Vcc such as 5.0 V or 3.3 V, and $C_3$ and $C_4$ designate connections. In this case, the connections $C_3$ and $C_4$ are formed by a first metal layer made of polycrystalline silicon or aluminum, and the connections $C_1$ and $C_2$ are formed by a second metal layer made of polycrystalline silicon or aluminum.

Figure 1:
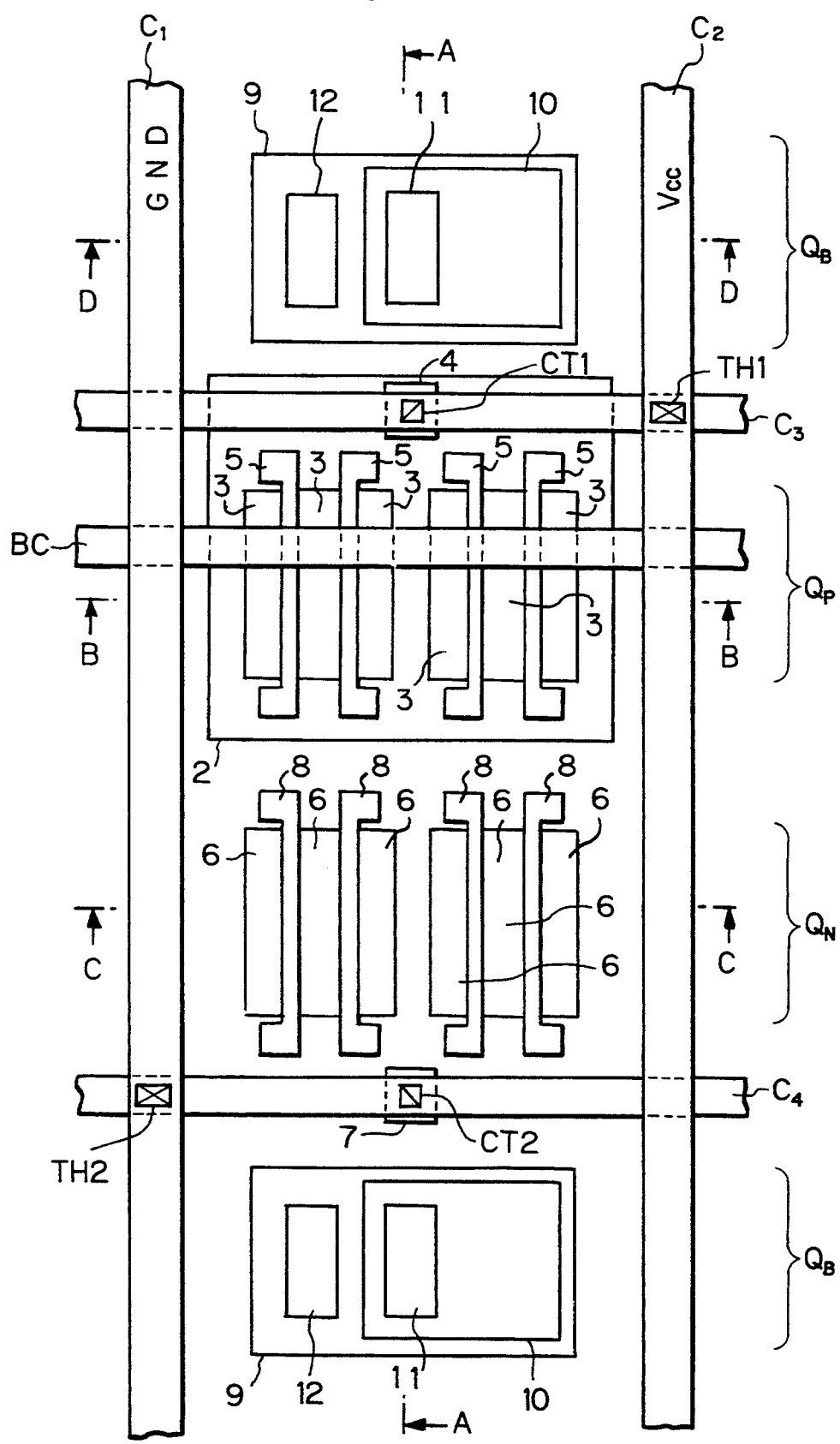
FIG. 1 is a plan view illustrating a prior art BiCMOS gate array integrated semiconductor device.
Figure 2A:
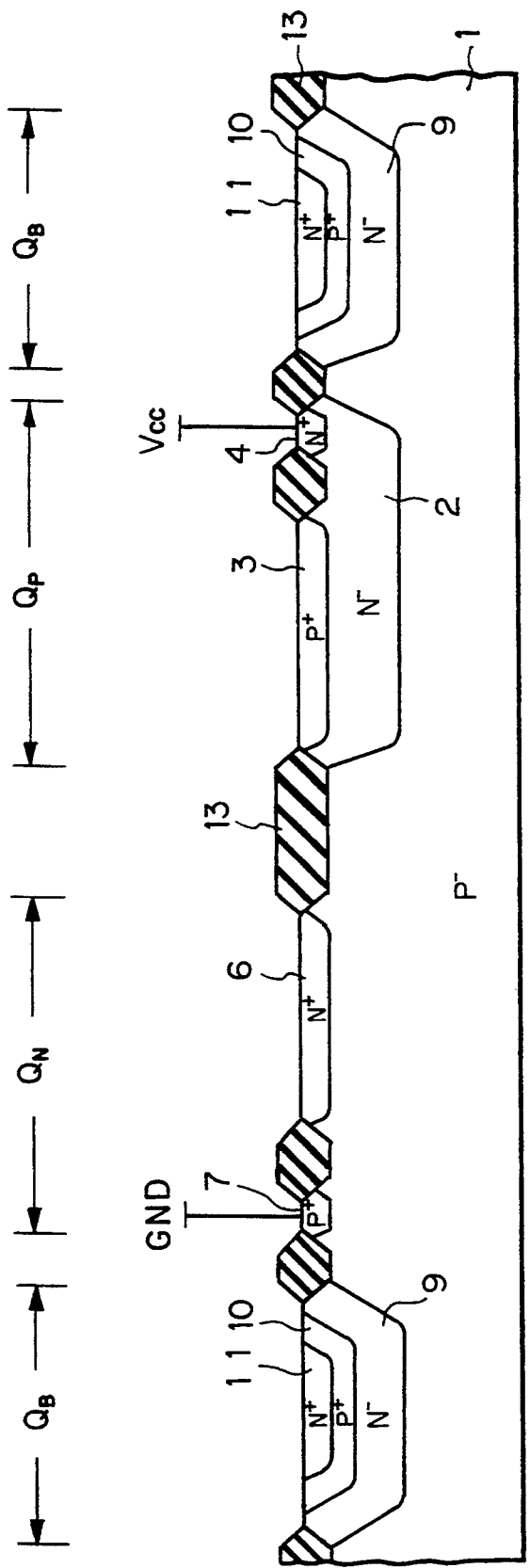
FIG. 2A is a cross-sectional view taken along the line A—A of FIG. 1.
Figure 2B:
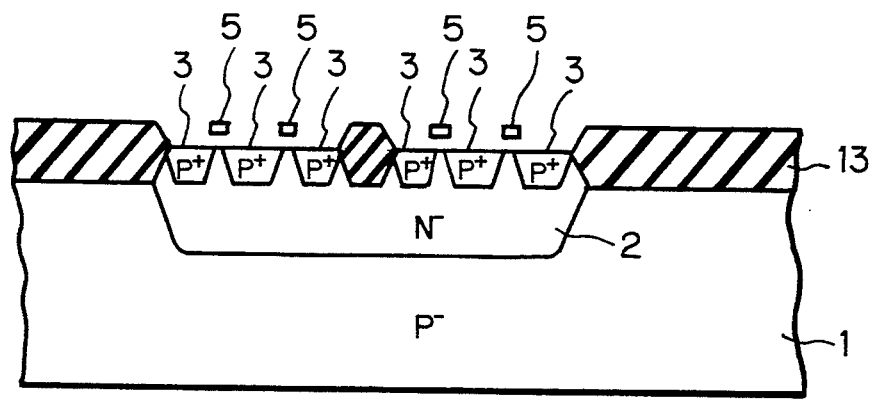
FIG. 2B is a cross-sectional view taken along the line B—B of FIG. 1.

Referring to FIGS. 1, FIGS. 2A and 2B which are cross-sectional views taken along the lines A—A and B—B of FIG. 1, respectively, the unit cell $Q_P$ is formed within an N$^-$-type well 2 which is also formed within a P$^-$-type semiconductor substrate 1. Further, formed in the N$^-$-well 2 are P$^+$-type impurity regions 3 which serve as source/drain regions. Also, reference numeral 4 designates an N$^+$-type impurity region for applying the power supply potential Vcc to the N$^-$-type well 2. That is, the power supply connection (Vcc) $C_2$ is connected via a throughhole TH1 to the connection $C_3$ which is also connected via a contact hole CH1 to the N$^-$-type well 2. Thus, the P$^-$-type semiconductor 1 and the N$^-$-type well 2 are reversely-biased, i.e., a junction capacity is generated therebetween, to contribute to the stabilization of the power supply potential Vcc. In this case, note that the $p^-$-type semiconductor 1 is grounded, as will be later explained.

Figure 2C:
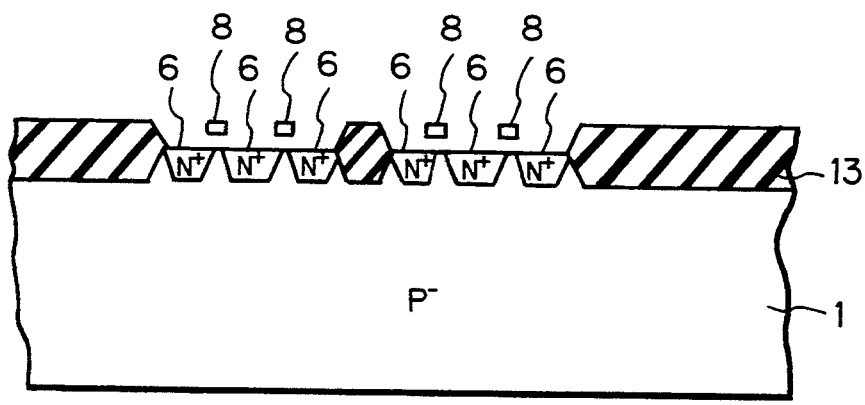
FIG. 2C is a cross-sectional view taken along the line C—C of FIG. 1.

Referring to FIGS. 1, 2A and 2C which are cross-sectional views taken along the lines A—A and C—C of FIG. 1, respectively, the unit cell $Q_N$ is formed within the $P^-$-type semiconductor substrate 1. Also, formed in the $P^-$-type semiconductor substrate 1 are $N^+$-type impurity regions 6 which serve as source/drain regions. Further reference numeral 7 designates a $P^+$-type impurity region for applying the ground potential GND to the $P^-$-type semiconductor substrate 1. That is, the power supply connection (GND) $C_1$ is connected via a throughhole TH2 to the connection $C_4$ which is also connected via a contact hole CH2 to the $P^-$-type semiconductor substrate 1. Thus, the $P^-$-type semiconductor 1 and the $N^+$-type impurity regions 6 are reversely-biased, i.e., a junction capacity is generated therebetween, to contribute to the stabilization of the ground potential GND.

Figure 2D:
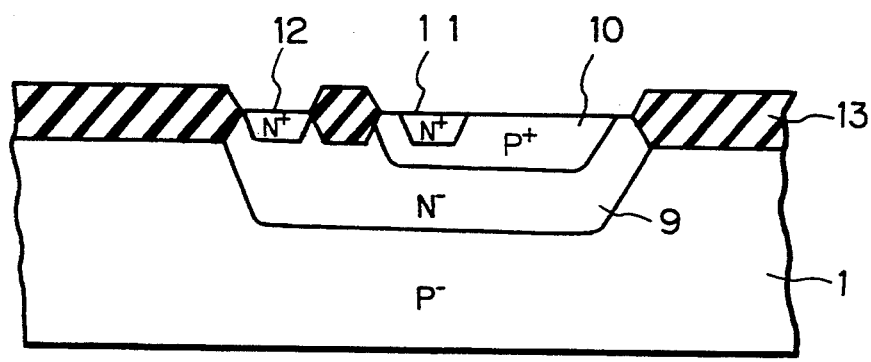
FIG. 2D is a cross-sectional view taken along the line D—D of FIG. 1.

Referring to FIGS. 1, 2A and 2D which are cross-sectional views taken along the lines A—A and D—D of FIG. 1, respectively, the unit cell $Q_E$ is formed by an $N^-$-type collector region 9, a $P^+$-type base region 10, and an $N^+$-type emitter region 11, which are formed within the $P^-$-type semiconductor substrate 1. Also, formed in the collector region 9 is an $N^+$-type impurity region 12 which serves as a collector electrode. No connection is provided for the regions 9, 10, 11 and 12.

On the above-mentioned unused unit cells $Q_P$, $Q_N$ and $Q_E$, there are no interconnections individually for the unused unit cells, but bypass connections such as BC can be provided.

In FIGS. 2A, 2B, 2C and 2D, reference numeral 13 designates a thick insulator for isolating transistor element areas. This thick insulator 13 is, for example, formed by thermogrowing monocrystalline silicon such as the semiconductor substrate 1.

In the prior art gate array integrated semiconductor device of FIGS. 1, 2A, 2B, 2C and 2D, however, when this device is highly integrated, the capacity of the power supply connections is small so that the potentials thereof fluctuate even when use is made of the junction capacity with the semiconductor substrate 1.

In FIGS. 3, 4A, 4B, 4C and 4D, which correspond to FIGS. 1, 2A, 2B, 2C and 2D, respectively, a first embodiment of the present invention is illustrated.

Figure 3:
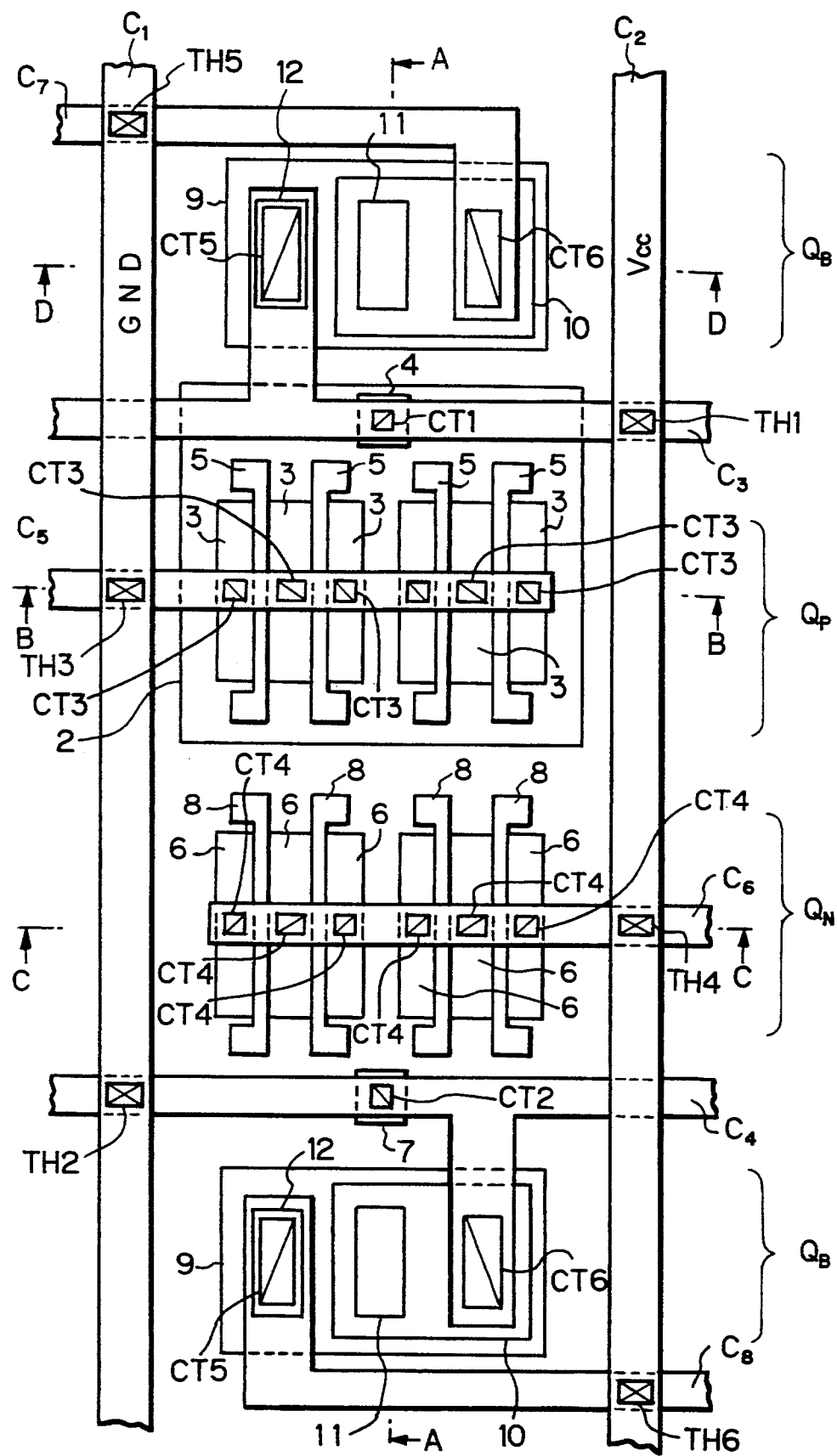
FIG. 3 is a plan view illustrating a first embodiment of the gate array integrated semiconductor device according to the present invention.
Figure 4A:
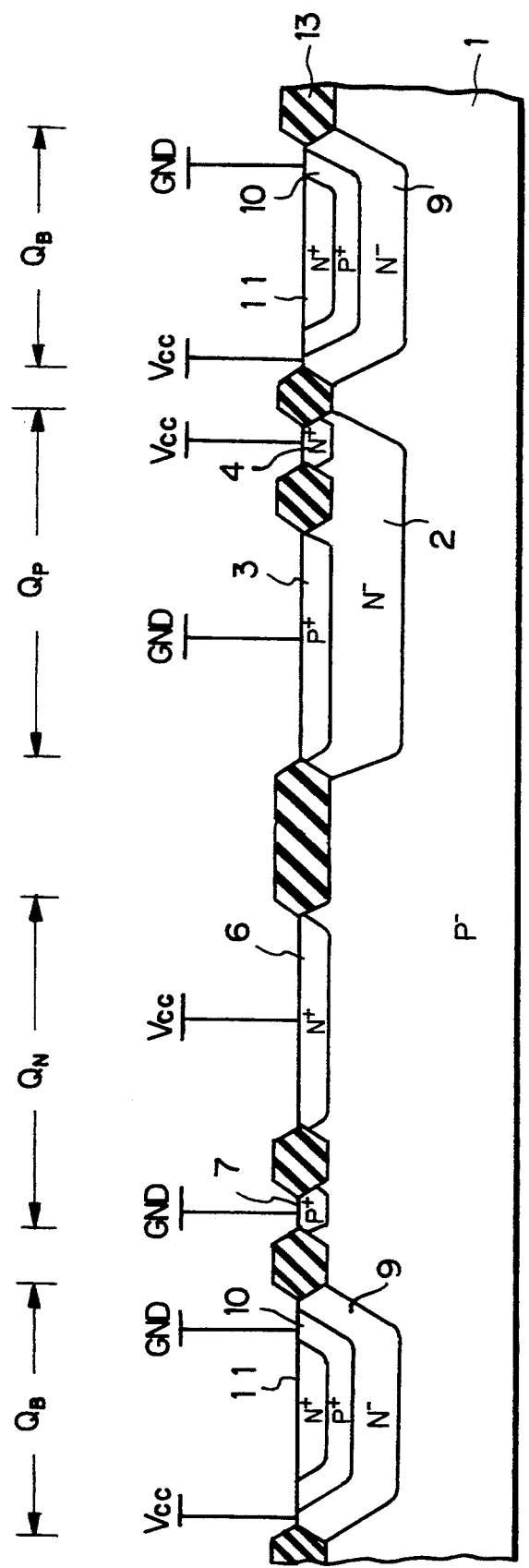
FIG. 4A is a cross-sectional view taken along the line A—A of FIG. 3.
Figure 4B:
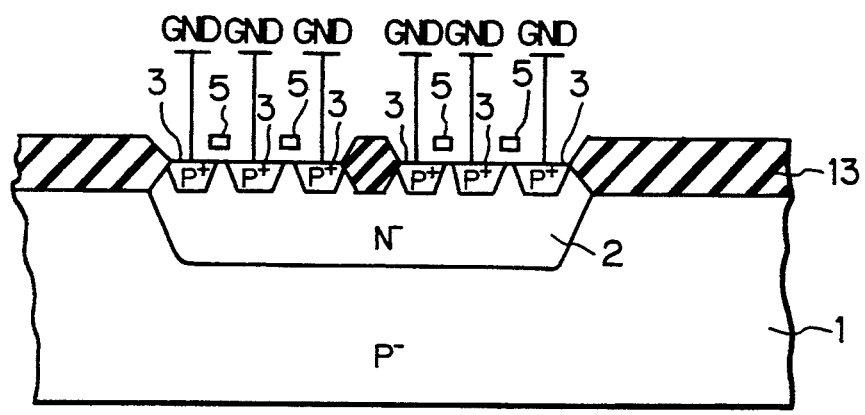
FIG. 4B is a cross-sectional view taken along the line B—B of FIG. 3.

Referring to FIGS. 3, 4A and 4B, the $P^+$-type impurity regions (source/drain regions) 3 of the unit cell $Q_P$ are grounded. That is, the ground connection (GND) $C_1$ is connected via a throughhole TH3 to a connection $C_5$ which is, in this case, made of the first metal layer, and the connection $C_5$ is connected via contact holes CT3 to the $P^+$-type impurity regions 3. Thus, the $N^-$-type well 2 and the $P^+$-type impurity regions 3 are reversely-biased, i.e., a junction capacity is generated therebetween, to contribute to the stabilization of the power supply potential Vcc as well as the stabilization of the ground potential GND.

Figure 4C:
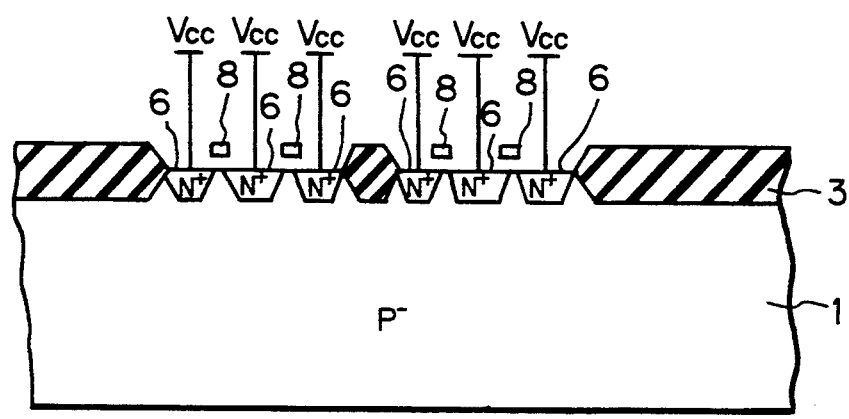
FIG. 4C is a cross-sectional view taken along the line C—C of FIG. 3.

Referring to FIGS. 3, 4A and 4C, the $P^+$-type impurity regions (source/drain regions) of the unit cell $Q_N$ are powered by the power supply potential Vcc. That is, the power supply connection (Vcc) $C_2$ is connected via a throughhole TH4 to a connection $C_6$ which is, in this case, made of the first metal layer, and the connection $C_6$ is connected via contact holes CT4 to the $N^+$-type impurity regions 6. Thus, the $P^-$-type semiconductor substrate 1 and the $N^+$-type impurity regions 6 are reversely-biased, i.e., a junction capacity is generated therebetween, to contribute to the stabilization of the ground potential GND as well as the stabilization of the power supply potential Vcc.

Figure 4D:
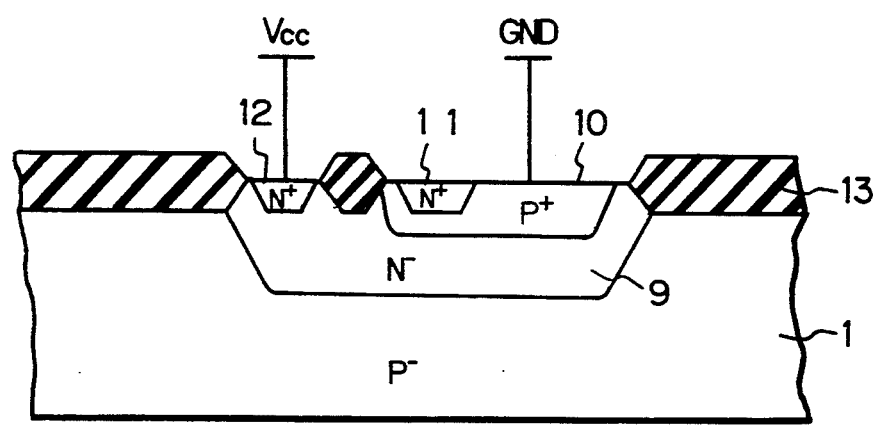
FIG. 4D is a cross-sectional view taken along the line D—D of FIG. 3.
Figure 5A:
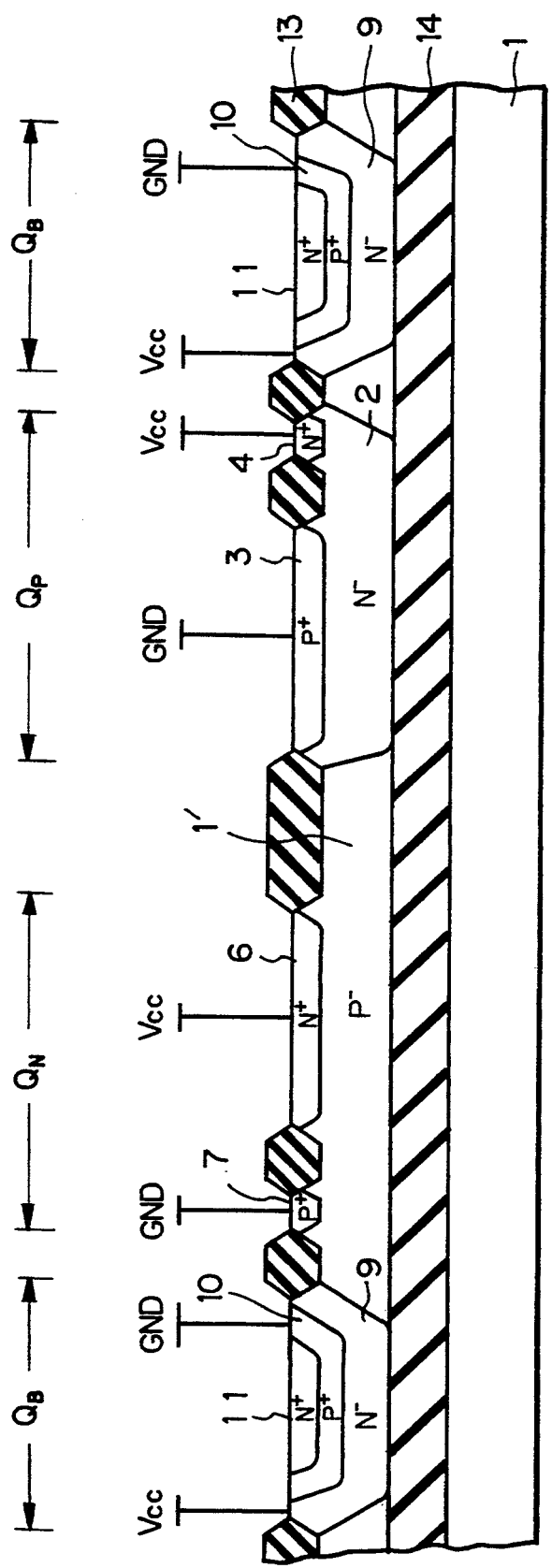
FIGS. 5A through 5D are cross-sectional views of modifications of FIGS. 4A through 4D, respectively.
Figure 5B:
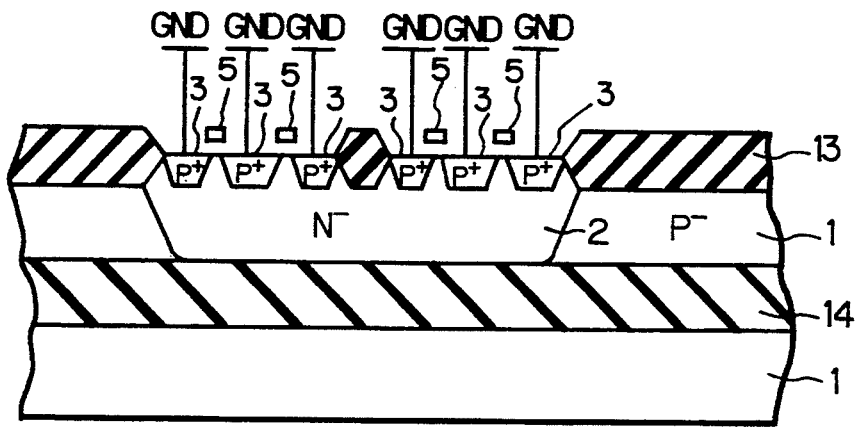
Figure 5C:
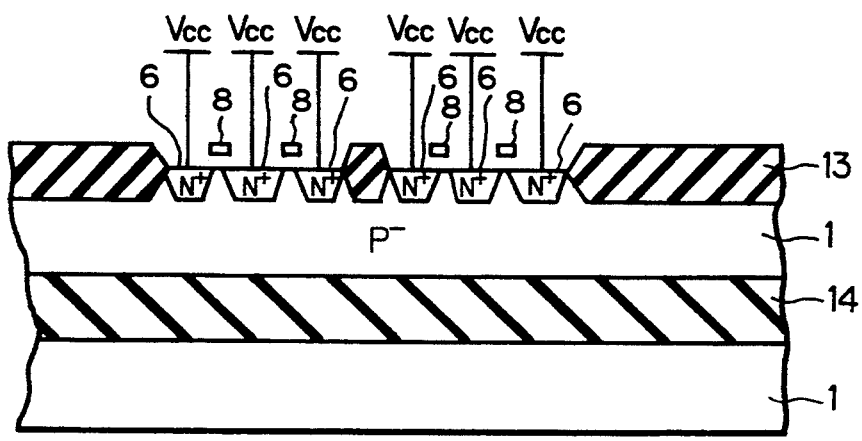
Figure 5D:
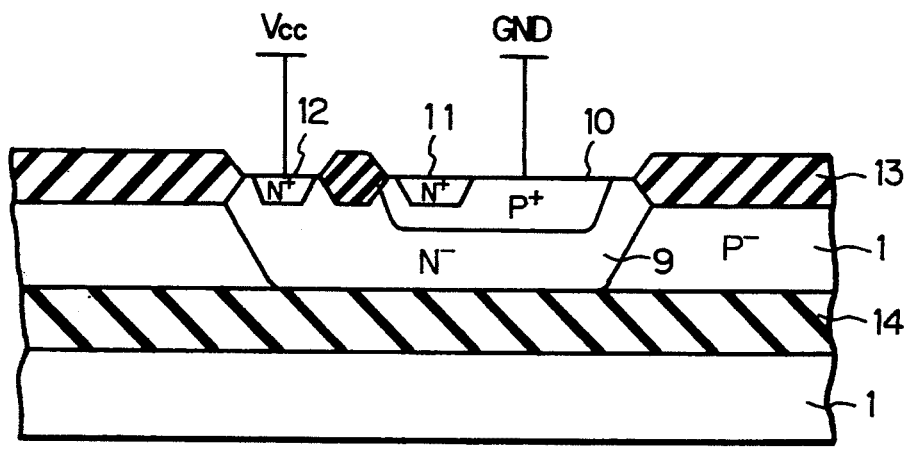
Figure 6:
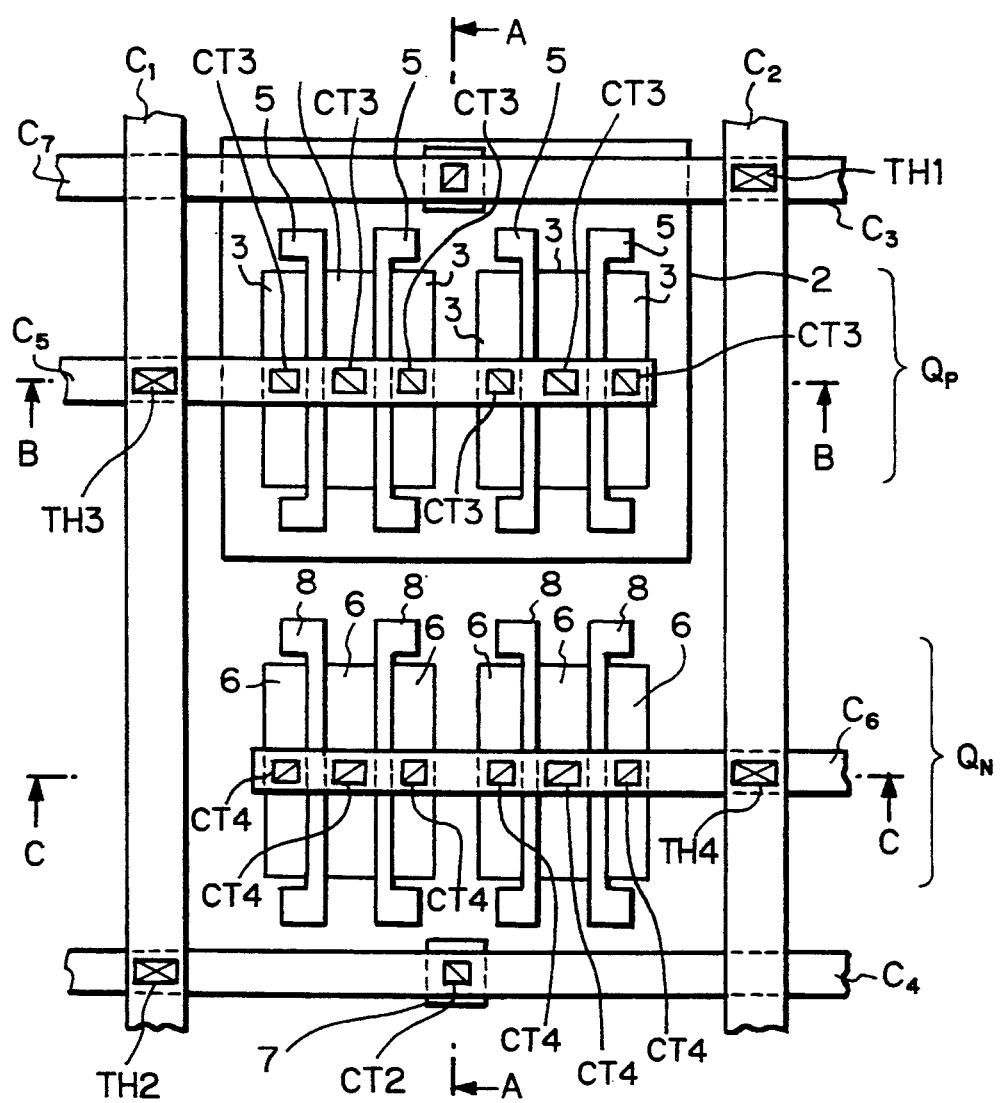
FIG. 6 is a plan view illustrating a second embodiment of the gate array integrated semiconductor device according to the present invention.

Referring to FIGS. 3, 4A and 4D, the collector region 9 (and its electrode 12) of the unit cell $Q_E$ is powered by the power supply potential Vcc, and the base region 10 of the unit cell $Q_E$ is grounded. The ground connection (GND) $C_1$ is connected via a throughhole TH5 to a connection $C_7$ (or via a throughhole TH2 to a connection $C_4$), and is further connected via a contact hole CT6 to the base region 10. In addition, the power supply connection (Vcc) $C_2$ is connected via the throughhole TH1 to the connection $C_3$ (or via a throughhole TH6 to a connection $C_8$), and is further connected via a contact hole CT5 to the $N^+$-type region 12. Thus, the collector region 9 and the base region 10 are reversely-biased, i.e., a junction capacity is generated therebetween, to contribute the stabilization of the ground potential as well as the stabilization of the power supply potential Vcc.

In FIGS. 5A, 5B, 5C and 5D, which are modifications of FIGS. 4A, 4B, 4C and 4D, respectively, the BiCMOS gate array integrated semiconductor device of FIG. 1 is formed by using a semiconductor on-insulator (SOI) configuration. That is, a thick insulator 14 is added to the elements of FIGS. 4A, 4B, 4C and 4D. In such an SOI configuration, parasitic capacity with the semiconductor substrate 1 is reduced to increase the operation of the device, however, this degrades the stabilization of the ground potential GND and the stabilization of the power supply potential Vcc, since there is no generated junction capacity between the connection $C_1$ ($C_2$) and the semiconductor substrate 1. Therefore, the increased capacity between the ground connection $C_1$ and the power supply connection $C_2$ according to the present invention is effectively useful in the stabilization of the ground potential GND and the power supply potential Vcc.

In FIGS. 5A, 5B, 5C and 5D, reference numeral 1' is a $P^-$-type semiconductor region which is, for example, an epitaxial layer.

Also, in the bipolar unit cell $Q_E$ of the above-mentioned first embodiment, although the connections $C_1$ and $C_2$ are arranged to reversely-bias the collector region 9 and the base region 10, it is possible to reversely-bias the base region 10 and the emitter region 11. In this case, the Vcc connection $C_2$ is connected to the emitter region 11 instead of the collector electrode region 12. Note that the junction capacity generated by reversely-biasing the collector region 9 and the base region 10 is larger than the junction capacity generated by reversely-biasing the base region 10 and the emitter region 11, due to the difference in boundary areas.

Figure 7A:
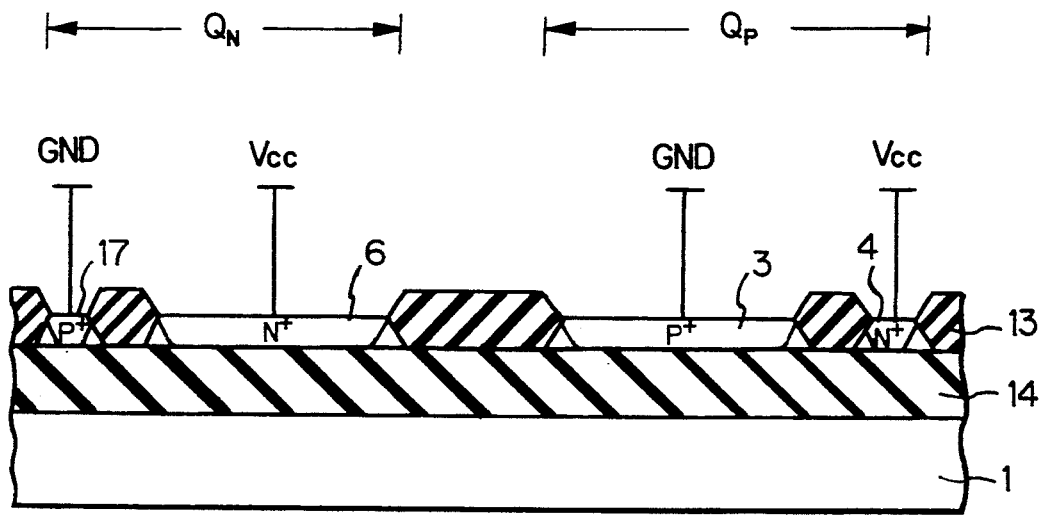
FIG. 7A is a cross-sectional view taken along the line A—A of FIG. 6.
Figure 7B:
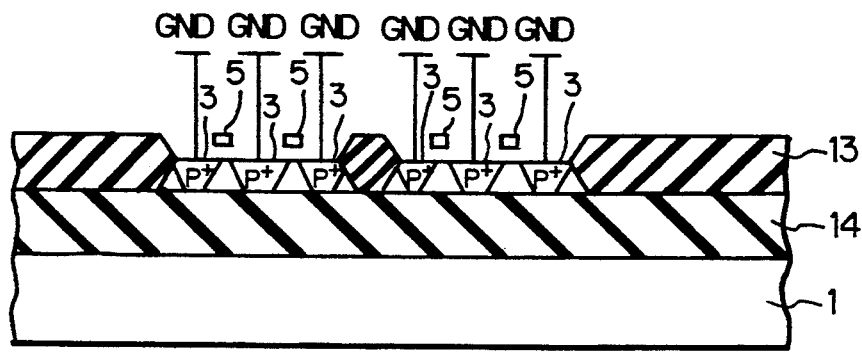
FIG. 7B is a cross-sectional view taken along the line B—B of FIG. 6.
Figure 7C:
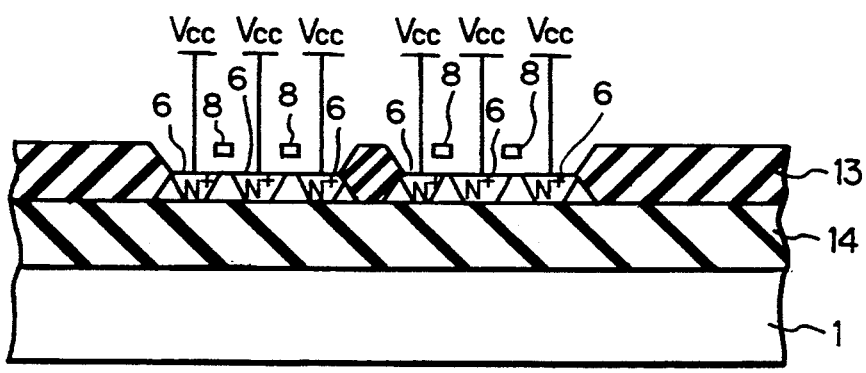
FIG. 7C is a cross-sectional view taken along the line C—C of FIG. 6.

In FIGS. 6, 7A, 7B and 7C, which correspond to FIG. 3, 5A, 5B and 5C, respectively, a second embodiment of the present invention is illustrated. The second embodiment is applied to a CMOS gate array integrated semiconductor device using a separation by implanted oxygen (SIMOX) configuration. That is, as illustrated in FIGS. 7A, 7B and 7C, the thick insulator 14 is located directly beneath the thick insulator 13 and the impurity regions 3 and 6. Therefore, the bipolar transistor unit cell $Q_E$ of the first embodiment is not provided.

Also, in the second embodiment, a junction capacity between the ground potential connection $C_1$ and the power supply connection $C_2$ is generated, although it is smaller than in the first embodiment. Therefore, the ground potential GND and the power supply potential Vcc can be stabilized.

In the above-mentioned embodiments, when using a 0.8 μm rule, the source regions and the drain regions have a junction capacity of about $5.0 \times 10^{-4}$ F/m². If one of the unit cells $Q_P$ nd $Q_N$ has an area of $200 \times 10^{-12}$ m², the increased injunction capacity per one unit cell $Q_P(Q_N)$ according to the present invention is about 0.1 pF=$5.0 \times 10^{-4} \times 200$ pF. For example, in a $5 \times 10^4$-gate CMOS gate array, since there are usually more than $1 \times 10^4$ unused unit cells, there may be generated a junction capacity between the connections $C_1$ and $C_2$, which is very helpful in stabilizing the ground potential GND and the power supply potential Vcc.

As explained hereinbefore, according to the present invention, a junction capacity is generated between the power supply connections in unused unit cells, and accordingly, the potentials at the power supply connections can be stabilized.

I claim:

1. A gate array integrated semiconductor device comprising:
    a first power supply connection for receiving a first potential;
    a second power supply connection for receiving a second potential which is higher than the first potential; and
    at least one unused unit cell, whose transistors are never operated, each unused unit cell including a P-type region connected to said first power supply connection and an N-type region connected to said second power supply connection, one of said P-type region and N-type region being formed within the other, thereby reversely-biasing said P-type and N-type regions.

2. A device as set forth in claim 1, being of an SOI configuration.

3. A device as set forth in claim 1, being of an SIMOX configuration.

4. A gate array integrated semiconductor device comprising;
    a first power supply connection for receiving a first potential;
    a second power supply connection for receiving a second potential which is higher than the first potential; and
    at least one unused unit cell of a P-channel MOS transistor type, whose transistors are never operated, each unused unit cell including an N-type semiconductor region connected to said second power supply connection and P-type semiconductor regions connected to said first power supply connection, said P-type semiconductor regions being formed within said N-type semiconductor region, thereby reversely-biasing said N-type and P-type semiconductor regions.

5. A device as set forth in claim 4, being of an SOI configuration.

6. A device as set forth in claim 4, being of an SIMOX configuration.

7. A gate array integrated semiconductor device comprising;
    a first power supply connection for receiving a first potential;
    a second power supply connection for receiving a second potential which is higher that the first potential; and
    at least one unused unit cell of a N-channel MOS transistor type, whose transistors are never operated, each unused unit cell including a P-type semiconductor region connected to said first power supply connection and N-type semiconductor regions connected to said second power supply connection, said N-type semiconductor regions being formed within said P-type semiconductor regions, thereby reversely-biasing said P-type and N-type semiconductor regions.

8. A device as set forth in claim 7, being of an SOI configuration.

9. A device as set forth in claim 7, being of an SIMOX configuration.

10. A gate array integrated semiconductor device comprising:
    a first power supply connection for receiving a first potential;
    a second power supply connection for receiving a second potential which is higher than the first potential; and
    at least one unused unit cell of an NPN bipolar transistor type, whose transistors are never operated, each unused unit cell including a P-type semiconductor region connected to said first power supply connection and two N-type semiconductor regions sandwiching said P-type semiconductor region, one of said N-type semiconductor regions being connected to said second power supply connection, thereby reversely-biasing said N-type semiconductor region and said P-type semiconductor region.

11. A device as set forth in claim 10, being of an SOI configuration.

12. A device as set forth in claim 10, being of an SIMOX configuration.

13. A gate array integrated semiconductor device comprising;
    a first power supply connection for receiving a first potential;
    a second power supply connection for receiving a second potential which is higher than the first potential; and
    at least one unused unit cell of a PNP bipolar transistor type, whose transistors are never operated, each unused unit cell including a N-type semiconductor region connected to said second power supply connection and two P-type semiconductor regions sandwiching said N-type semiconductor region, one of said P-type semiconductor regions being connected to said first power supply connection, thereby reversely-biasing said P-type semiconductor region and said N-type semiconductor region.

14. A device as set forth in claim 13, being of an SOI configuration.

15. A device as set forth in claim 13, being of an SIMOX configuration.

* * * * *

UNITED STATES PATENT AND TRADEMARK OFFICE
CERTIFICATE OF CORRECTION

PATENT NO. : 5,397,906
DATED : March 14, 1995
INVENTOR(S) : Kouichi Kumagai

It is certified that error appears in the above-indentified patent and that said Letters Patent is hereby corrected as shown below:

Column 3, line 24, change "$Q_E$" to --$Q_B$--.

Column 3, line 32, change "$Q_E$" to --$Q_B$--.

Column 4, line 7, change "$Q_E$" to --$Q_B$--.

Column 4, line 9, change "$Q_E$" to --$Q_B$--.

Column 4, line 44, change "$Q_E$" to --$Q_B$--.

Column 4, line 65, change "$Q_E$" to --$Q_B$--.

Signed and Sealed this

Seventeenth Day of October, 1995

Attest:

BRUCE LEHMAN

*Attesting Officer*  *Commissioner of Patents and Trademarks*